United States Patent

Lehureau et al.

[11] Patent Number: 5,872,764
[45] Date of Patent: Feb. 16, 1999

[54] LIGHT EMITTER-RECEIVER DEVICE AND OPTICAL READING SYSTEM

[75] Inventors: Jean-Claude Lehureau, Ste Genevieve des Bois; Jean-Charles Renaud, Vitry S/Seine, both of France

[73] Assignee: Thomson-CSF, Paris, France

[21] Appl. No.: 731,638

[22] Filed: Oct. 16, 1996

[30] Foreign Application Priority Data

Oct. 17, 1995 [FR] France ................................ 95 12147

[51] Int. Cl.⁶ .................................................. G11B 7/00
[52] U.S. Cl. ........................ 369/120; 369/109; 369/112; 369/121
[58] Field of Search .................................. 369/109, 112, 369/44.11, 44.12, 44.14, 44.37, 100, 116, 120, 121, 122; 372/43, 45, 46, 47, 48, 50

[56] References Cited

U.S. PATENT DOCUMENTS

| | | |
|---|---|---|
| 3,913,076 | 10/1975 | Lehureau et al. . |
| 3,919,698 | 11/1975 | Bricot et al. . |
| 3,971,002 | 7/1976 | Bricot et al. . |
| 4,023,033 | 5/1977 | Bricot et al. . |
| 4,025,784 | 5/1977 | Lehureau et al. . |
| 4,037,251 | 7/1977 | Bricot et al. . |
| 4,038,524 | 7/1977 | Puech et al. . |
| 4,039,764 | 8/1977 | Bricot et al. . |
| 4,059,841 | 11/1977 | Bricot et al. . |
| 4,079,247 | 3/1978 | Bricot et al. . |
| 4,079,248 | 3/1978 | Lehureau et al. . |
| 4,128,309 | 12/1978 | Lehureau et al. . |
| 4,138,663 | 2/1979 | Lehureau et al. . |
| 4,139,263 | 2/1979 | Lehureau et al. . |
| 4,142,208 | 2/1979 | Oprandi et al. . |
| 4,143,402 | 3/1979 | Bricot et al. . |
| 4,171,879 | 10/1979 | Bricot et al. . |
| 4,176,277 | 11/1979 | Bricot et al. . |
| 4,199,783 | 4/1980 | Huignard et al. . |
| 4,203,133 | 5/1980 | Bricot et al. . |
| 4,260,993 | 4/1981 | Aubry et al. . |
| 4,275,275 | 6/1981 | Bricot et al. . |
| 4,308,545 | 12/1981 | Lehureau et al. . |
| 4,321,634 | 3/1982 | Lehureau . |
| 4,380,016 | 4/1983 | Lehureau et al. . |
| 4,405,862 | 9/1983 | Bricot et al. . |
| 5,157,641 | 10/1992 | Lehureau . |
| 5,172,368 | 12/1992 | Lehureau . |
| 5,544,143 | 8/1996 | Kay et al. ........................... 369/112 X |

FOREIGN PATENT DOCUMENTS

| | | |
|---|---|---|
| 0 452 793 | 10/1991 | European Pat. Off. . |
| 0 555 097 | 8/1993 | European Pat. Off. . |
| 0 627 733 | 12/1994 | European Pat. Off. . |
| 0 671 734 | 9/1995 | European Pat. Off. . |
| 2 274 740 | 8/1994 | United Kingdom . |

OTHER PUBLICATIONS

"Diode Laser for Both Transmitting and Receiving Optical Signals," Donald R. Scifres, et al. Xerox Disclosure Journal; vol. 7, No. 4. Jul./Aug. 1982; pp. 237–238.

*Primary Examiner*—Paul W. Huber
*Attorney, Agent, or Firm*—Oblon, Spivak, McClelland, Maier & Neustadt, P.C.

[57] ABSTRACT

The disclosure relates to a laser (L) and to at least one detector integrated side by side on one and the same substrate so that the laser emits, through the edge of the device, a light beam along a direction and so that the detector can detect, through the same edge of the device, a beam substantially parallel to this direction of emission. In a system for the optical reading of a recording medium, the light emitted is reflected by the medium to be read to the detector or detectors. A diffraction grating (RZ) that diffracts only diffraction waves with the same sign (positive for example) deflects at least a part of the light to the detector or detectors. Application to the reading of optical disks.

25 Claims, 9 Drawing Sheets

0 ORDER

+1 ORDER

−1 ORDER

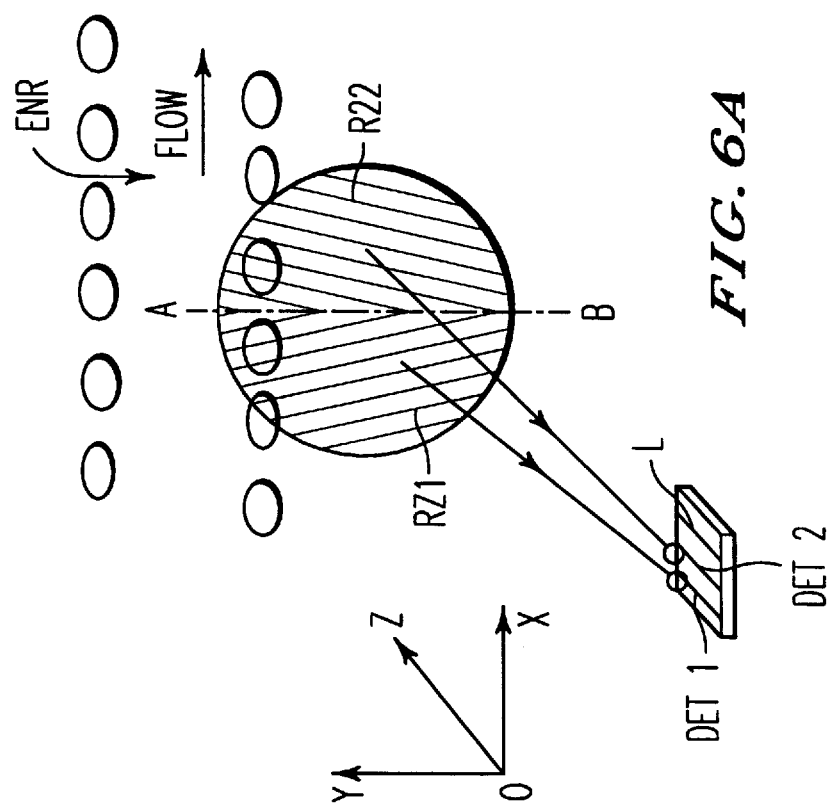

FIG. 8A DIODE 1 AND DIODE 2

FIG. 8B D1 + D2, $\overline{D1 + D2}$

FIG. 8C Z = D1_D2 FOR D1 + D2 > $\overline{D1 + D2}$

FIG. 8D e = D1_D2 FOR D1 + D2 < $\overline{D1 + D2}$

LIGHT EMITTER-RECEIVER DEVICE AND OPTICAL READING SYSTEM

BACKGROUND OF THE INVENTION

The invention relates to a light emitter-receiver device and its application to a system for the optical reading of a recording medium.

The invention can be applied especially to the reading of optical disks and relates to the optical system of reading known in the prior art as the optical pick-up technique.

An optical pick-up system consists of:

- a downline part combining the optical focusing system and the actuators enabling this optical system to be shifted so that the track being read is followed radially and in focusing;
- an upline part combining the write/read laser sources;
- at least one splitter enabling the return beam to be redirected to the detectors;
- optical means for the concealment or deformation of the beam enabling the detectors to extract the read signals, focusing error signals and track following error signals.

The laser component or components are generally made on a substrate of gallium arsenide while the detectors are made on a silicon substrate.

The invention relates first of all to the upline pick-up part. It reduces the number of components and simplifies the adjusting operation by integrating the detector function into the laser chip.

It is also known that a component made on a gallium arsenide substrate may form a detector: in the field of telecommunications, this property has been used to make alternating two-way communications (half duplex communications). The laser diode is then either forward biased so as to emit light or reverse biased so as to give a photocurrent proportional to the light received. In the field of optical reading pick-ups, it has been proposed to make profitable use of the fact that the light reflected on a disk is refocused with precision on the source to read the information by modification of the current induced to the laser. This method has never been used to make truly operational systems for the quality of the signal in forward bias is insufficient and because there have been no means enabling the extraction of the focusing and track following signal.

SUMMARY OF THE INVENTION

The invention therefore relates to a light emitter-receiver device comprising a stack of layers of semiconductor materials comprising on either side of the stack a first current injection electrode and a second current injection electrode enabling the stack of layers to be made to work in laser mode and emitting a light beam by an edge of the stack, one of the electrodes having the shape of a strip, wherein said device comprises at least one first detection electrode placed on the border of said edge, enabling the stack to be made to work in photodetector mode in cooperation with a second detection electrode positioned on the other side of the stack as well as means for the lateral guidance of the light in the zones located beneath the detection electrode and beneath the strip-shaped electrode as well as means for the optical decoupling and electrical insulation of the zones of the stack located beneath the two electrodes.

The invention also relates to a system for the optical reading of a recording medium comprising an emitter-receiver device in such a way that the emitter-receiver device can emit light to a recording medium and in such a way that the light reflected by this medium is transmitted to at least one of the detectors.

This system has a diffraction grating designed to be located between the emitter-receiver device and the recording medium, transmitting the light that it receives from the laser to the recording medium and deflecting the light that it receives from the recording medium to at least one of the detectors.

More particularly, the diffraction grating is substantially linear and gives rise only to orders of diffraction having one and the same sign (positive for example).

BRIEF DESCRIPTION OF THE DRAWINGS

The various objects and characteristics of the invention shall appear more clearly in the following description and from the appended figures, of which:

FIGS. 6a to 6g are figures illustrating the working of the system of the invention and the positions of the detectors DET1, DET2;

FIG. 8 shows an example of experimental signals obtained.

MORE DETAILED DESCRIPTION

Figure 1:
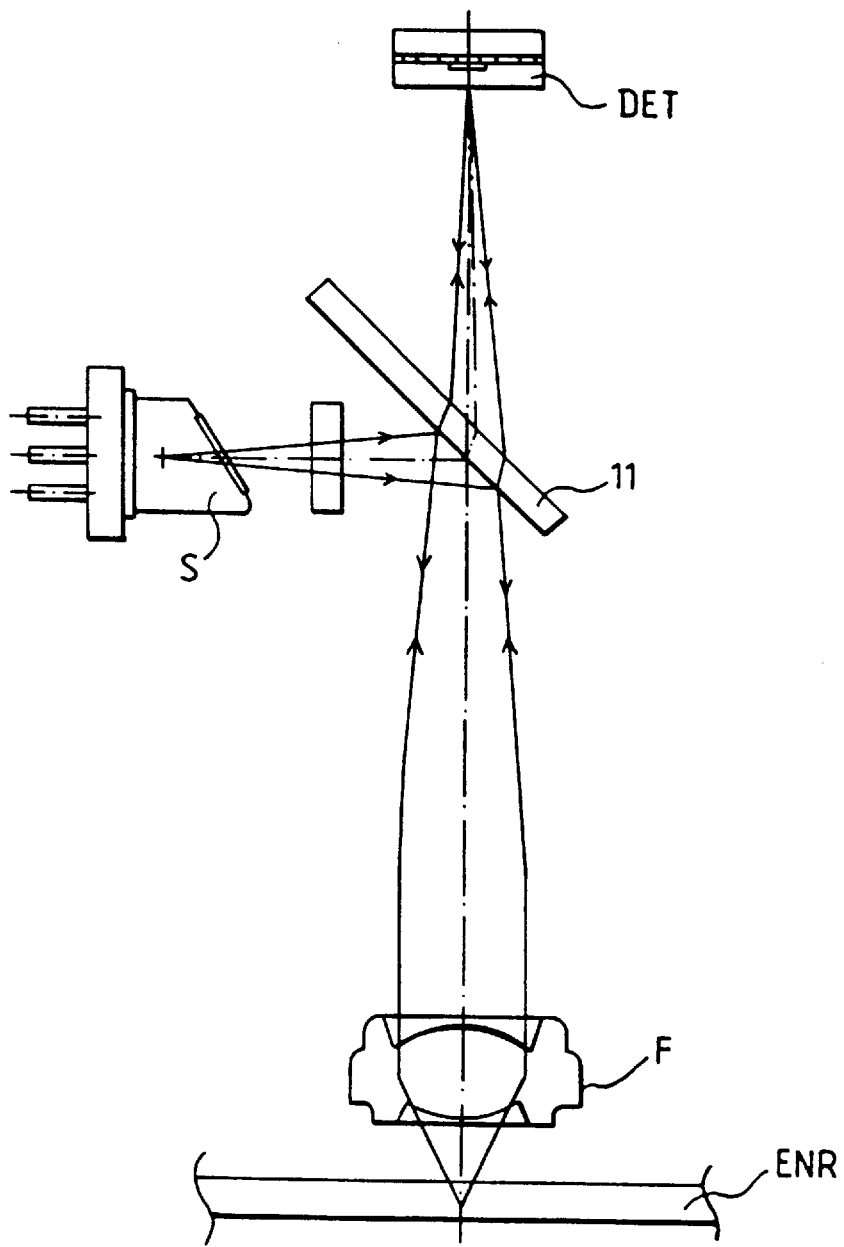
FIG. 1 shows a system for the optical reading of a recording medium known in the prior art.

FIG. 1 shows an optical pick-up according to one of the embodiments most commonly used.

The beam coming from the optical source S is transmitted by a beam splitter 11 and an optical focusing device F to the recording medium to be read ENR. This recording medium reflects the beam to the beam splitter 11 which retransmits a part of it to a detector DET. It must be noted that, on the return journey, the crossing of the splitter 11 may induce a certain astigmatism in the beam which may be profitably used to extract a focusing error signal.

Figure 2A:
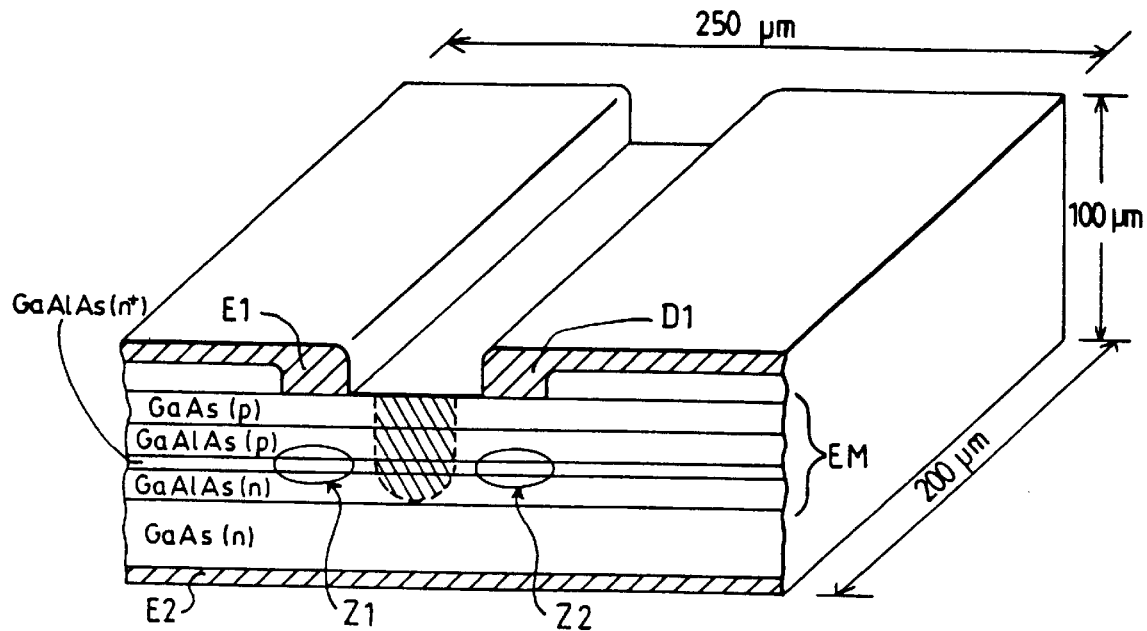
FIGS. 2a and 2b show light emitter-receiver devices according to the invention.

FIG. 2a shows an exemplary embodiment of a emitter-receiver device according to the invention. This device has a stack of layers EM of semiconductor materials forming a semiconductor laser. For example it has, on a GaAs substrate, a confinement layer made of n doped GaAlAs, an active layer made of n doped GaAlAs, another confinement layer made of p doped GaAlAs and a contact layer made of p doped GaAs. On either side, electrodes E1 and E2 enable the injection of an excitation current into the stack. The electrode E1 has the shape of a strip. Beneath this strip, guidance means enable the guidance of the light parallel to this strip. These guidance means may take the form of an implantation of protons in at least the upper confinement layer on either side of the guided zone. According to another technique, the active layer may be etched by microlithography. The faces of the device that are perpendicular to the direction of the guide are cleaved. The laser emits light along the zone Z1.

According to the invention, there is provided an electrode D1 positioned beside the electrode E1. Beneath the electrode D1, guidance means enable the light reaching the zone Z2 to be guided in the stack of layers L. This stack is capable of working as an optical detector and a current is detected between the electrodes D1 and E2. Decoupling means, such as an insulation zone IS, enable the electrical and optical decoupling of the laser from the detector.

Preferably, the contact zone of the electrode D1 is greater than that of the electrode E1. Furthermore, the electrode D1 does not necessarily have the shape of a strip.

According to FIG. 2a, the electrode E2 is common to the laser part and the detection part, but there could be two separate electrodes. Finally, the electrode E2 is shown on the face opposite the substrate bearing the stack EM. However, it is possible to arrange for it to be on the face bearing the stack. It would then be necessary to have two electrodes: one electrode associated with the stack of the laser and one electrode associated with the stack of the detector.

Figure 2B:
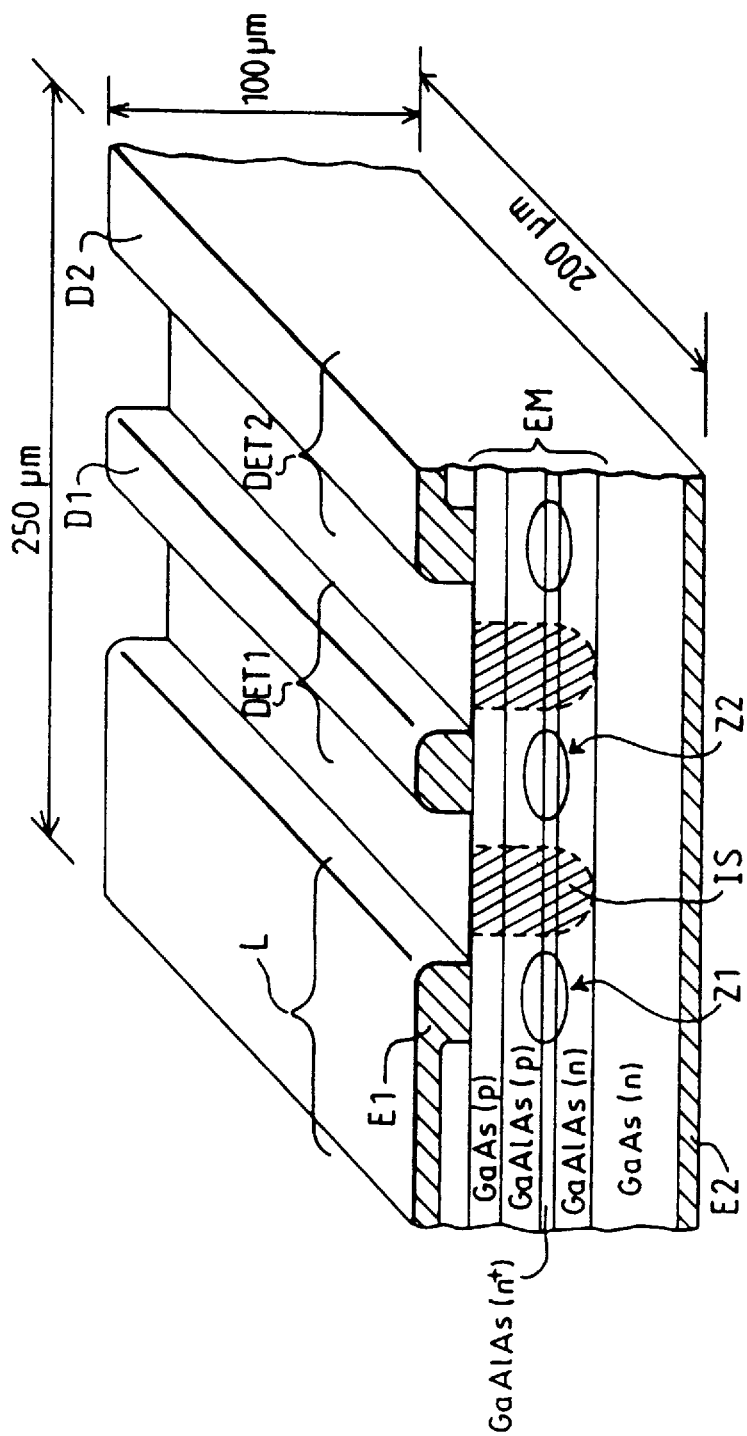

FIG. 2b shows a component comprising a laser L and two detectors DET1 and DET2. The two detectors according to this exemplary embodiment are located in one and the same side with respect to the laser L. They are electrically insulated and optically decoupled from one another.

Figure 3:
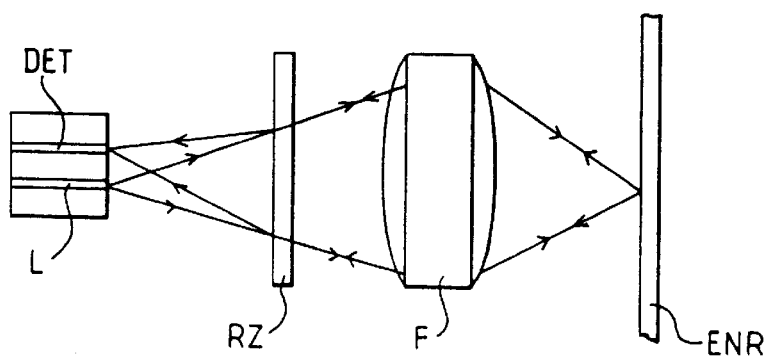
FIG. 3 shows a system for the optical reading of a recording medium according to the invention.

FIG. 3 shows an exemplary application of the device of FIG. 2 to a system for the optical reading of a recording medium. The emitter-receiver device as described with reference to FIG. 2 is shown schematically to the left of FIG. 3. The laser L emits a beam that is transmitted by a diffraction grating RZ to an optical focusing system F that focuses the light on the recording system ENR. This system reflects the light towards the optical focusing system and the grating RZ. This grating RZ has the particular feature of diffracting light so as to present only orders of diffraction that are located on one side of the optical axis of the system. In other words, it gives rise only to orders of diffraction that all have the same sign (positive for example). The order of diffraction, which is +1 (for example) is thus focused by the detector DET.

Figure 4A:
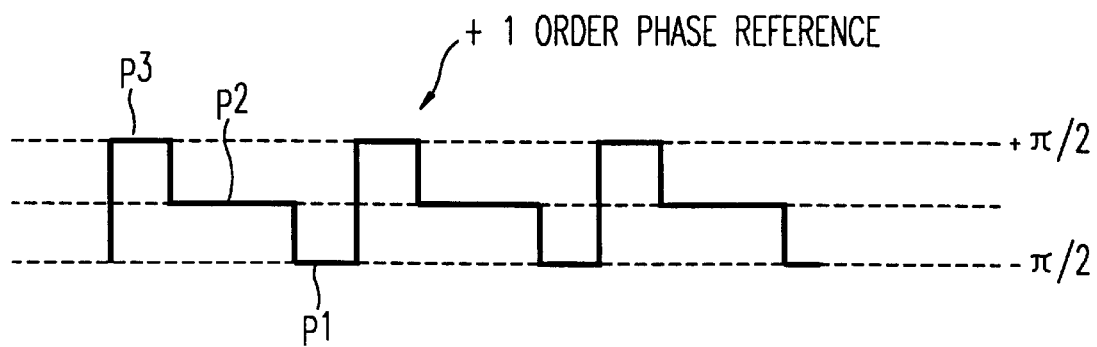
FIGS. 4a to 4d show an exemplary embodiment of a grating applicable to the system of FIG. 3.

For example, the diffraction grating may be made as shown in FIG. 4a. It then has a series of linear relief features whose section has three levels. The phase shift between the lower level p1 (the hollow of the relief features) and the upper level p3 (the ridge of the relief features) is substantially equal to $\pi$ radians for the light to be processed. For a grating in transmission mode etched on the surface of a medium with an index of 1.5, this corresponds to an etching depth equal to the wavelength. The intermediate level p2 is at mid-distance between the levels p1 and p3. In the example of FIG. 4, the dimensions of the levels p1 and p3 are equal to a quarter of the pitch of the grating and the level p2 is equal to half the pitch of the grating. The pitch of the grating is substantially equal to 5 to 200 pm (in the range of some tens of micrometers).

Figure 4B:
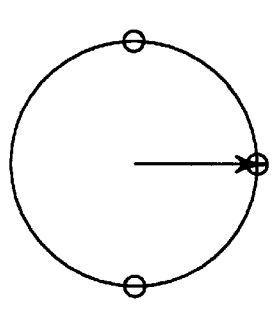
Figure 4C:
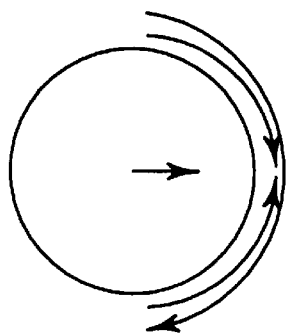
Figure 4D:
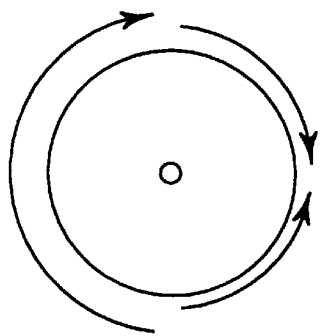

FIG. 4a shows a type of grating profile that is interesting in that it can be made by the superposition of two binary masks. FIGS. 4b to 4d show that this grating has transmission equal to 25% in the 0 order (which greatly reduces the light reflected on the laser) and equal to strictly zero in the −1 order. This grating diffracts the essential part of the light not transmitted by the 0 order towards the first order, namely towards the cells.

It is clear that a grating of this kind can also be made by means of holography techniques by interference light beams.

Volume diffracting structures (Bragg's grating) also make it possible to eliminate the −1 order.

Figure 5A:
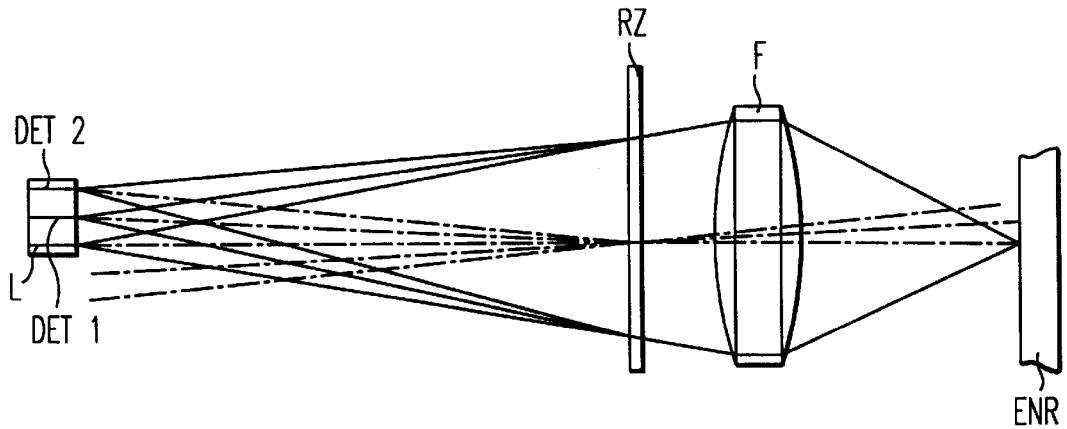
FIG. 5a shows an exemplary embodiment of a system according to the invention enabling a setting of focus and a following of information tracks.

FIG. 5a shows an exemplary embodiment in which two detectors are integrated into the same substrate of the laser. These detectors receive light by the same facet of the chip by which the laser emits. The component used may be of the type shown in FIG. 2b. According to one variant, it is possible to separate the laser technologically from the detectors, the detectors being then made separately from the laser.

A component formed by two half-gratings of different pitches enables the collection, on the return journey, of a part of the light reflected by the recording medium and the redirection of this part towards each of the detectors. The profile of the gratings is chosen so as to cancel any order diffracted in a direction that we shall arbitrarily call the −1 order. The rules of optics require that this dissymmetry between the +1 order and the −1 order should occur on one and the same side of the 0 order for the incident beam and the reflected beam. In the plane of FIG. 5a, this corresponds to the fact that the light is partly deflected towards the top of the figure, both on the outward journey and on the return journey. The light deflected on the outward journey is reflected by the disk (if the angle of deflection is small) and re-imaged by the optical system on the facet of the GaAs chip on the side opposite the detector; there is no interference between this signal and the main signal which corresponds to the non-diffracted beam on the outward journey that is deflected towards the detectors after reflection. This structure makes profitable use of the fact that in the event of efficient focusing, the non-deflected beam after reflection follows exactly the reverse path of the incident beam and gets focused on the emission face. This reflected beam is reflected as a small angle and the positioning of the deflecting element is tolerant both in rotation and in translation.

FIG. 6a shows a view in perspective in which the plane of the recording medium ENR is parallel to a plane xOy. The two half-gratings RZ1, RZ2 are parallel to this plane. The line of separation AB of the two half-gratings RZ1, RZ2 is parallel to the axis Oy which is substantially perpendicular to the direction of reading of the information elements on the recording medium. The emission face of the laser L as well as the detection faces of the detectors DET1 and DET2 are aligned in a direction parallel to Ox (perpendicular to Oy).

Figure 5B:
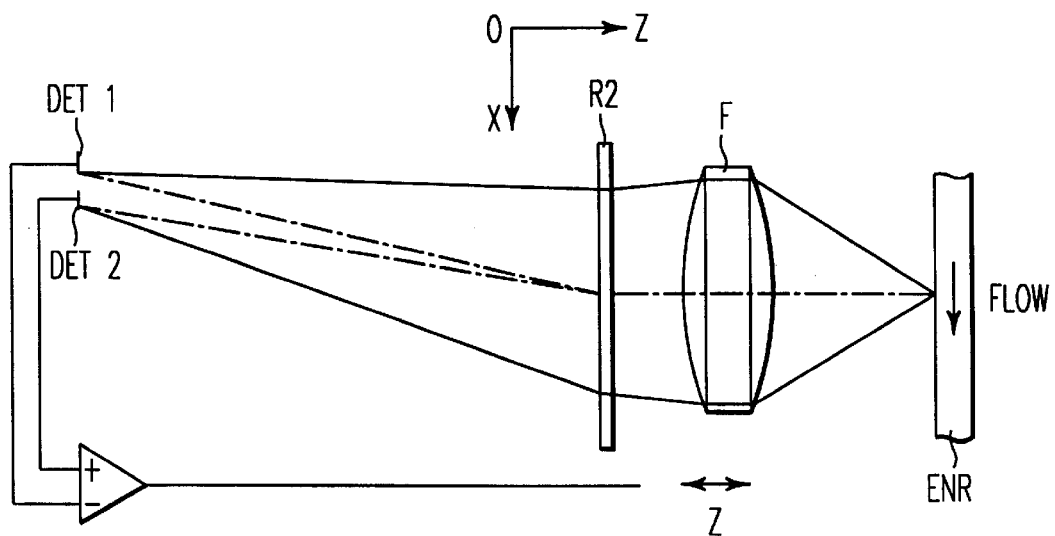
FIG. 5b shows a system providing for a circuit for the use of signals given by the detectors DET1 and DET2.

According to FIG. 5b, the signals of the detectors are combined in a circuit to give signals to set the focusing of the reading beam on the recording medium as well as signals for following the track of information elements on the medium.

The detection of focusing is of an asymmetrical type similarly to the focusing device described in the French patent No. 2 325 953. However, in the present system, the setting can be done by means of two beams resulting from the deflection by the two half-gratings. These two beams correspond to the two halves of the pupil of the optical focusing system F.

Figure 6B:
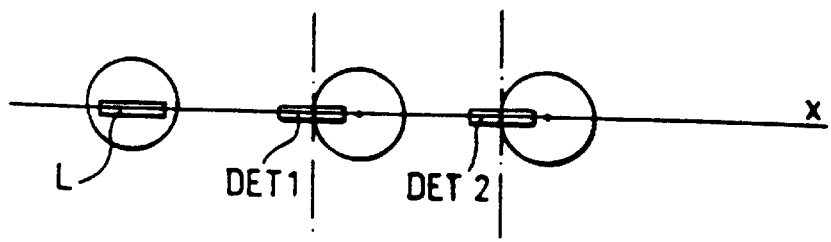
Figure 6C:
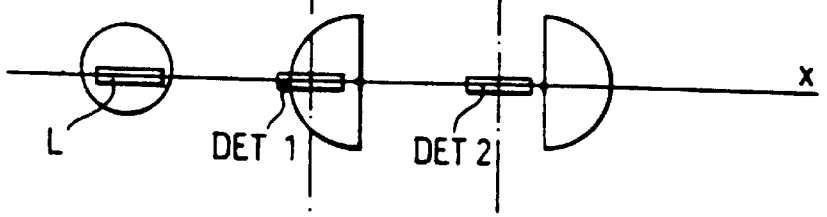
Figure 6D:
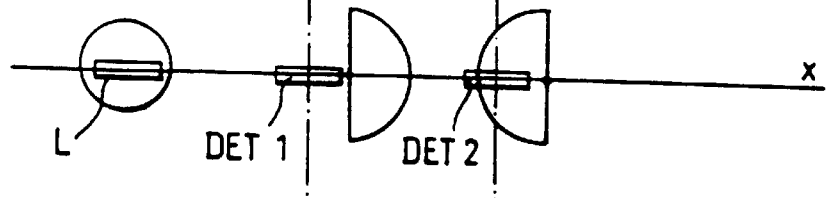

To enable the detection of a defocusing of the system, the detectors DET1 and DET2 are off-centered with respect to the axis of the beams that they receive when the system is focused. Thus, FIG. 6b shows the emission face of the laser L and the detection faces of the detectors DET1 and DET2. These devices are aligned (along the axis Ox in FIG. 6a): after reflection by the recording medium, the light is directed towards the detectors DET1 and DET2 in such a way that when the system is focused the light makes spots on the detectors. The centers of these spots are offset laterally on one and the same side with respect to the detectors DET1 and DET2 (FIG. 6b). In the event of defocusing, the beams will make spots such that a single detector will be illuminated (or will be more illuminated than the other). In the event of a defocusing in one direction, the detector DET1 will be illuminated (FIG. 6c) and a defocusing in the other direction will give rise to the illumination of the detector DET2 (FIG. 6d).

Figure 6E:
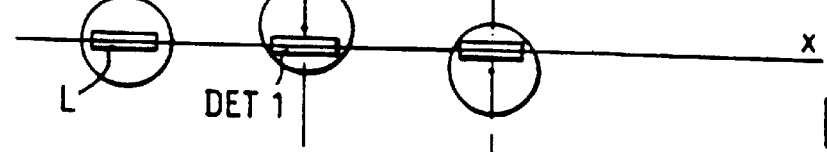

The two sensors DET1 and DET2 also enable the radial following of the information tracks of the recording medium. For this purpose (see FIG. 6e) when the system is focused, the centers of the light spots are offset to one side of the axis Ox for one of the detectors (towards the top for example for the detector DET1) and on the other side of the axis Ox for the other detector (towards the bottom for the detector DET2).

It is also possible to provide for a slight obliqueness, in reverse directions, of the two half-gratings to image the beams slightly above or below each detector. This obliqueness is shown in FIG. 6a.

Figure 6F:
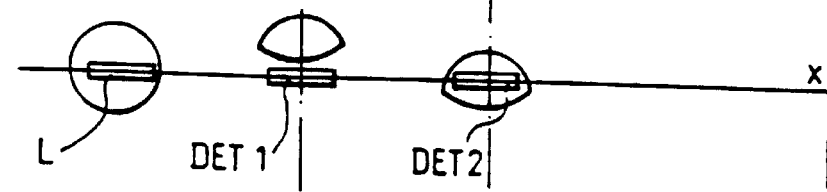

As can be seen in FIG. 6f, a radial track following error may give rise to an illumination of a detector (DET2 for example) while the other will not be illuminated or will be less illuminated.

Figure 6G:
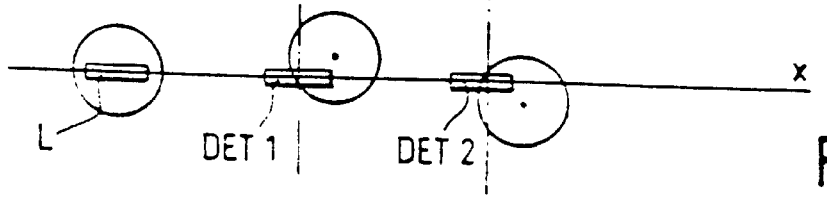

The setting of focusing and the track following operations can be done by means of the same detectors DET1 and DET2. For this purpose, the two offsets stipulated in FIGS. 6b and 6e will be combined so as to have spots on the detectors DET1 and DET2 as shown in FIG. 6g when the system is focused, namely on one and the same side of the detectors along the axis x and on either side of the detectors along the perpendicular to the axis x.

According to an alternative embodiment, it can be planned to have the emission and reception faces of the laser and the detectors aligned along a direction parallel to Oy instead of being perpendicular as has been described with reference to FIG. 6a.

In this case, to set the focusing, the centers of the spots of the beams transmitted by the gratings RZ1 and RZ2, when the system is focused, are offset on one and the same side with respect to the line of detectors.

To adjust the track following, the centers of these spots are offset in parallel to the alignment of the detectors (direction Oy) in opposite directions with respect to the detectors, namely for example to the right of the detector DET1 and to the left for the detector DET2.

Figure 7:
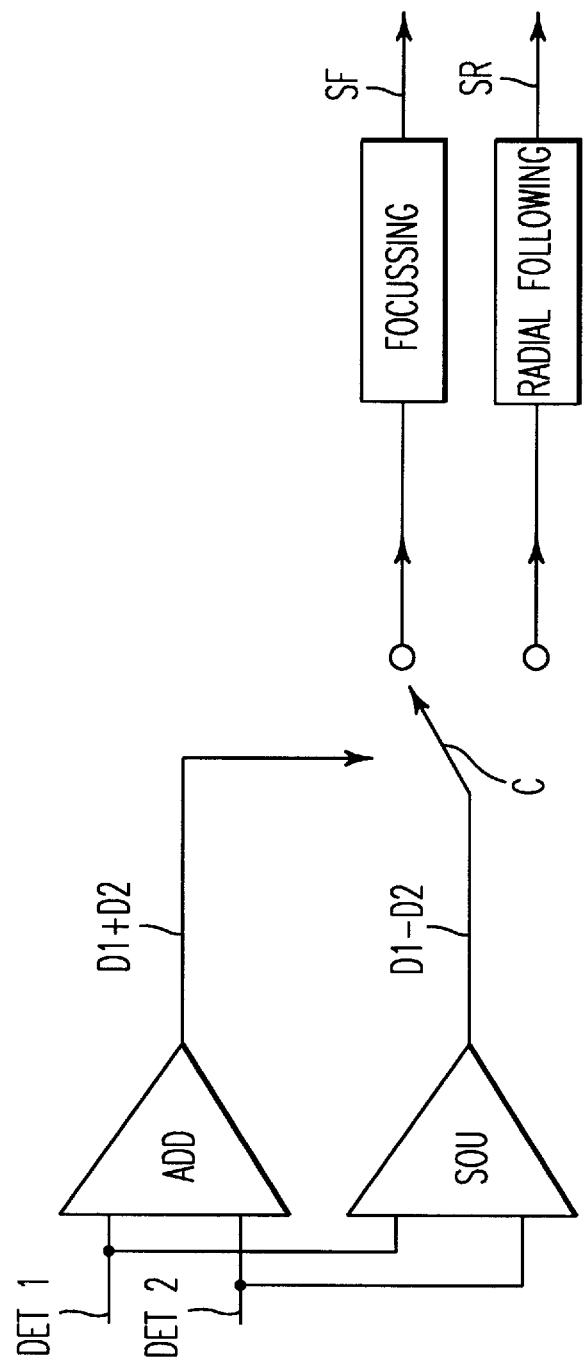
FIG. 7 shows an example of circuits for the processing of the signals given by the detectors DET1, DET2.

FIG. 7 gives a view of a circuit for the processing of the signals given by the detectors DET1 and DET2. A circuit ADD carries out the addition D1+D2 of these signals. A circuit SOU takes the difference D1−D2 between these signals.

When the sum signal D1+D2 is greater than a threshold value (maximum value), this fact corresponding in an optical disk to reflection by a non-etched zone of the disk, the switch C is placed in a position such it connects the subtraction circuit SOU to a focusing processing circuit. The focusing processing circuit therefore receives the difference D1−D2 and depending on the sign and the value D1−D2, this circuit gives a focus setting signal SF that acts on the focus setting devices (not shown).

When the sum signal D1+D2 is smaller than a threshold value, this corresponds to a zone of the recording medium comprising information elements. The switch C connects the circuit SOU to a track following radial adjustment circuit. This circuit, depending on the sign and value of D1−D2, gives a radial following signal SR that enables action on a track following system (not shown).

FIG. 8 shows the experimental results of extraction of radial error signals by the above method. The great difference in amplitude between the radial error component detected during the upper and lower half-waves of the sum signal can be seen. On the contrary, the focusing error signal is proportional to the amplitude of the sum signal and therefore typically three times greater during the positive half-wave of the sum signal.

It must be noted that the source D1+D2 of the signals of the detectors can be used as an information reading system. The system of the invention has the advantage of integrating the detectors DET1 and DET2 into the same component as the laser but also of requiring only two detectors for:

the focusing;
the track following;
the reading of information.

What is claimed is:

1. A light emitter-receiver device, comprising:
a stack of layers of semiconductor materials;
a first current injection electrode and a further electrode cooperating to enable the stack to emit a light beam from a laser zone beneath said first current injection electrode at an edge of the stack;
at least one first detection electrode formed on said stack with a portion bordering said edge, said at least one first detection electrode and a further detection electrode cooperating to provide a first light detector including a first light detection zone beneath said at least one first detection electrode, said first light detection zone having a portion on said edge;
means for laterally guiding light in the zones located beneath the at least one first detection electrode and beneath the first current injection electrode, and
means added to portions of the layers of the stack extending between the zones for optically decoupling and electrically insulating the zones from each other.

2. An emitter-receiver device according to claim 1, wherein the stack includes a substrate and wherein the further electrode and the further detection electrode are on a same substrate surface as the stack or on an opposite substrate surface.

3. The emitter-receiver device according to claim 2, wherein the further electrode and the further detection electrode are parts of a common electrode.

4. A system including the emitter-receiver device according to claim 1 and means for providing light to a recording medium and returning light from the recording medium to at least the first light detector.

5. The system according to claim 4, wherein said means for providing light to the recording medium and returning light from the recording medium includes a diffraction grating located between the emitter-receiver device and the recording medium, said diffraction grating transmitting light received from the laser zone to the recording medium and deflecting light received from the recording medium to at least the first light detector.

6. The system according to claim 5, wherein the diffraction grating is substantially linear and gives rise to orders of diffraction having only one sign.

7. The system according to claim 6, wherein each relief element of the diffraction grating has a lower, a middle, and an upper crenellated section with a distance between the upper level and the lower section generating a phase-shift substantially equal to 180° relative to a light beam having a same wavelength as that of the light from the laser zone.

8. The system according to claim 7, wherein the diffraction grating has a relief element pitch with the middle section having a width equal to half of the relief element pitch and the upper and lower section each being a plane zone with a width equal to a quarter of the relief element pitch, said two plane zones phase-shifting an incident wave having a same wavelength as the light from the laser source by plus or minus 90° with respect to the middle section.

9. The emitter-receiver device according to claim 1, further comprising:
a second detection electrode located on said stack beside the at least one first detection electrode and parallel to the at least one first detection electrode, said second detection electrode and said further detection electrode cooperating to provide a second light detector including a second light detection zone beneath said second detection electrode, said second light detection zone having a portion on said edge;
means for laterally guiding light in the second light detection zone; and
means added to portions of the layers of the stack extending between the zones for optically decoupling and electrically insulating the second light detection zone from the first light detection zone and the laser zone.

10. A system including the emitter-receiver device according to claim 9 and means between said emitter-receiver device and a recording medium for providing light from the laser zone to the recording medium and returning light from the recording medium to the first and second light detection zones.

11. The system according to claim 10, wherein the means between the emitter-receiver device and the recording medium comprises a diffraction grating which acts to transmit the light to the recording medium and to receive and deflect light from the recording medium to at least one of the first and second light detection zones.

12. The system according to claim 11, wherein the diffraction grating is substantially linear and provides orders of diffraction having only one sign.

13. The system according to claim 12, wherein each relief element of the diffraction grating has a lower, a middle, and an upper crenellated section with a distance between the upper level and the lower section generating a phase-shift substantially equal to 180° relative to a light beam having a same wavelength as that of the light from the laser zone.

14. The system according to claim 13, wherein the relief elements have a predetermined relief element pitch with the middle section having a width corresponding to half of the relief element and with the upper and lower section each having a plane zone bordering the middle section and having widths equal to a quarter of the relief element pitch to phase-shift incident waves by plus or minus 90° with respect to the middle section.

15. The system according to claim 11, wherein the diffraction grating comprises two juxtaposed half-gratings with different pitches and a direction of separation between the two half-gratings orthogonal to a direction of information flow on the recording medium and wherein the emitter-receiver device has the laser zone, the first detector zone and the second detector zone aligned in a direction of alignment parallel to the direction of separation of the two half-gratings.

16. The system according to claim 11, wherein the diffraction grating comprises two juxtaposed half-gratings with different pitches and a direction of separation between the two half-gratings orthogonal to a direction of information flow on the recording medium and wherein the emitter-receiver device has the laser zone, the first detector zone, and the second detector zone aligned in a direction of alignment perpendicular to the direction of separation of the two half-gratings.

17. The system according to claim 16, wherein the beams received by the detectors, when the system is focused, are located on one and the same side with respect to the direction of alignment of the detectors.

18. The system according to claim 16, wherein the beams received by the detectors, when the system is focused, are offset along the direction of alignment of the detectors, in opposite directions with respect to the centers of the detectors.

19. The system according to claim 16, wherein index lines of the two half-gratings form an angle different by 90° with respect to the direction of separation of the two half-gratings.

20. The system according to claim 16, further comprising:
an addition circuit configured to add signals received from the first and second detectors to form a sum signal;
a subtraction circuit configured to subtract signals received from the first and second detectors to form a difference signal;
a switch connected to the subtraction circuit, said switch placed in a first position by the addition circuit when the sum signal has a value greater than a first specified value and placed in a second position by the addition circuit when the sum signal has a value smaller than a second value;
a focus control circuit connected to the first position of the switch to receive the difference signal when the switch is in the first position to provide a focus control operation;
a track following control circuit connected to the second position of the switch to receive the difference signal when the switch is in the second position to provide a radial track following operation.

21. The system according to claim 16, wherein the detectors have their position offset along a direction of alignment of the detectors on the same side with respect to the axes of light beams transmitted by the two half-gratings when the system is focused.

22. The system according to claim 16, wherein the beams received by the detectors, when the system is focused, are located on either side of the direction of alignment of the detectors.

23. The system according to any one of claims 4–8 and 10–22, wherein the recording medium is an optical disk.

24. A system for optically reading a recording medium, comprising:
an emitter-receiver device including,
a laser source emitting a reading light beam, and
at least two optical detectors beside the laser source configured to detect a light beam incident thereon along a direction substantially parallel to the reading light beam;
a diffraction grating located between the emitter-receiver device and the recording medium, said diffraction grating having plural relief elements with each relief element having an upper, a middle, and a lower crenellated section with a distance between the upper and the lower section causing a phase shift substantially equal to 180° in a beam of light having a same wavelength as that of the reading light beam and acting to at least partially transmit the reading light beam to the recording medium and to at least partially deflect light received from the recording medium to at least one of the at least two optical detectors.

25. The system according to claim 24, wherein the at least two optical detectors are located on a same side of the laser source.

* * * * *